United States Patent [19]

Tsuboi et al.

[11] Patent Number: 5,052,009
[45] Date of Patent: Sep. 24, 1991

[54] SEMICONDUCTOR LASER DEVICE AND PROCESS OF ASSEMBLING THE SAME

[75] Inventors: Kunio Tsuboi, Saitama; Hiroshi Ishiyama, Kanagawa, both of Japan

[73] Assignee: Sony Corporation, Tokyo, Japan

[21] Appl. No.: 568,768

[22] Filed: Aug. 17, 1990

[30] Foreign Application Priority Data

Aug. 18, 1989 [JP] Japan .................. 1-212822

[51] Int. Cl.⁵ .................. H01S 3/04; H01L 23/02; H01L 33/00
[52] U.S. Cl. .................. 372/36; 357/17; 357/81; 357/74
[58] Field of Search .................. 372/34, 36; 357/80, 357/81, 74, 65, 68, 17

[56] References Cited

U.S. PATENT DOCUMENTS

| 4,136,351 | 1/1979 | Sugawara et al. | 357/17 |
| 4,338,577 | 7/1982 | Sato et al. | 372/36 |
| 4,493,143 | 1/1985 | Maier | 357/81 |
| 4,768,070 | 8/1988 | Takizawa et al. | 372/34 |
| 4,797,728 | 1/1989 | Dholakia et al. | 357/81 |
| 4,811,350 | 3/1989 | Yamamoto et al. | 372/36 |

Primary Examiner—Georgia Epps
Attorney, Agent, or Firm—Hill, Van Santen, Steadman & Simpson

[57] ABSTRACT

A process of assembling a semiconductor laser device which is reduced in number of assembling steps and a semiconductor laser device which can be produced at a reduced cost are disclosed. The semiconductor laser device comprises a stem having a lead mounting hole perforated therein and a lead extending through the lead mounting hole of the stem and fixed in an electrically isolated condition to the stem by way of an electrically insulating resin press fitted in the lead mounting hole. The lead is assembled to the stem by applying a pressure to the stem with the electrically insulating resin fitted in the lead mounting hole of the stem.

5 Claims, 3 Drawing Sheets

SEMICONDUCTOR LASER DEVICE AND PROCESS OF ASSEMBLING THE SAME

BACKGROUND OF THE INVENTION

1. Field of the Invention

This invention relates to a semiconductor laser device and a process of assembling the same, and more particularly to a semiconductor laser device having a lead extending through a lead mounting hole of and fixed to a stem by way of an insulator and also to a process of producing such semiconductor laser device.

2. Description of the Prior Art

A semiconductor laser device is already known and disclosed, for example, in Japanese Utility Model Laid-Open No. 61-85175 wherein a semiconductor laser element is assembled to a stem with a heat sink interposed therebetween and is sealed with a cap. In such semiconductor laser device, an electrode is led out for the external connection such that a lead is passed through a lead mounting hole formed in a stem and is fixed to the stem by way of glass and an inner end of the lead is connected to the electrode of the semiconductor laser device by way of a wire.

FIG. 6 shows a stem and a lead of such a semiconductor laser device. Referring to FIG. 6, a stem a has a supporting portion b formed in an integral relationship at a central portion of a surface thereof such that a semiconductor laser element not shown may be bonded to the support portion b. Three leads c are assembled to the stem a. In particular, one of the three leads c is fixed directly to a rear face of the stem a by means of welding while the other two leads c extend through lead mounting holes e of the stem a and is fixed to the stem a in an electrically isolated condition from the stem a by way of glass d filled between the leads c and the stem a in the lead mounting holes e.

Such two leads c are assembled to the stem a in such a manner as illustrated in FIGS. 7A and 7B. First, a pair of leads c each having an anodic oxidized surface and a pair of glass rings d each produced by molding special glass powder having a low melting point into a ring are prepared as seen in FIG. 7A. The anodic oxidation of the leads c facilitates fixation thereof to the glass rings d by melting of the glass rings d by heat.

Subsequently, the glass rings d are inserted into the lead mounting holes e of a stem a, and then the leads c are inserted into the glass rings d. Then, the stem a, glass rings d and leads c are placed in this condition into a furnace in which they are baked at a temperature of, for example, 420° to 430° C. to cause the glass rings d to melt in order to fusion mount the leads c onto the stem a as seen in FIG. 7B.

After the stem a to which the leads c are assembled is removed from the furnace, anodic oxidation films on surfaces of the leads c are removed and then the surfaces of the leads c are plated with a suitable metal. Anodic oxidation films must be removed because they are an insulator and will obstruct assurance of an electric conductivity of the leads c.

By the way, such a process of assembling a semiconductor laser device as illustrated in FIGS. 7A and 7B, that is, the assembling process of a semiconductor laser device wherein the leads c are passed into the lead mounting holes e of and fixed to the stem a by way of the glass d, is disadvantageous in that it has a comparatively great number of assembling steps and it is difficult to reduce the production cost of a semiconductor laser device. This is because the steps of anodic oxidizing leads c after shaping, fusion mounting the leads c onto the stem a by way of the glass rings d, removing anodic oxidation films on surfaces of the leads c and plating the surfaces of the leads c are required only for the assembly of such leads.

Besides, since the glass rings d require a very high material cost and besides likely get out of shape, operations of inserting the leads c into the glass rings d and then inserting the glass rings d into the lead mounting holes e of the stem a are difficult to carry out. Further, when the stem a is placed into a furnace in order to bake the glass, it is necessary to hold the stem a, glass rings d and leads c in a predetermined fixed positional relationship, and to this end, an expensive special carbon jig is required. Those facts make a factor of raising the cost of a semiconductor laser device and obstructing reduction in production cost of a semiconductor laser device.

SUMMARY OF THE INVENTION

It is an object of the present invention to provide a semiconductor laser device which can be produced at a low cost.

It is another object of the present invention to provide a process of assembling a semiconductor laser device by which a semiconductor laser device can be produced by a reduced number of assembling steps and at a reduced cost.

In order to attain the objects, according to an aspect of the present invention, there is provided a semiconductor laser device which comprises a stem having a lead mounting hole perforated therein, a semiconductor laser element fixed to a face of the stem, a lead having an end connected to the semiconductor element and extending through the lead mounting hole of the stem, and an electrically insulating resin element press fitted in the lead mounting hole of the stem for fixing the lead in an electrically isolated condition to the stem. The lead may have an intermediate crashed portion around which the electrically insulating resin element is provided by molding.

According to the present invention, the semiconductor laser device can be assembled by a process which comprises the steps of preparing in advance a lead having an electrically insulating resin element molded around an intermediate crashed portion thereof, press fitting the electrically insulating resin element together with the lead into a lead mounting hole perforated in a stem, and applying a pressure to the stem to caulk the stem to fix the lead to the stem by way of the electrically insulating resin element. Preferably, the pressure is applied radially inwardly to an outer periphery of the stem.

Or alternatively, the semiconductor laser device can be assembled by another process which comprises the steps of preparing in advance a material wire having a plurality of crashed portions formed at predetermined intervals thereon and each molded in an electrically insulating resin element, press fitting a frontmost one of the electrically insulating resin elements together with the material wire into a lead mounting hole perforated in a stem, cutting the material wire intermediately between the frontmost one and a second frontmost one of the electrically insulating resin elements to leave on the stem a lead which consists of the cut material wire and the frontmost electrically insulating resin element molded around the crashed portion of the cut material wire, and applying a pressure to the stem to caulk the stem to fix the lead to the stem by way of the electrically insulating resin element.

The semiconductor laser device of the present invention can thus be produced by such simplified process without the necessity of cumbersome steps of forming an anodic oxidation film on a lead, removing the anodic oxidation film after assembly of the lead to a stem and plating the lead with a suitable metal. Further, the employment of an electrically insulating resin material for the element for the fixation of the lead to the stem reduces the material cost of the semiconductor laser device comparing with glass. Accordingly, the semiconductor laser device can be produced at a reduced cost.

The above and other objects, features and advantages of the present invention will become apparent from the following description and the appended claims, taken in conjunction with the accompanying drawings.

DETAILED DESCRIPTION OF THE PREFERRED EMBODIMENT

Figure 1:
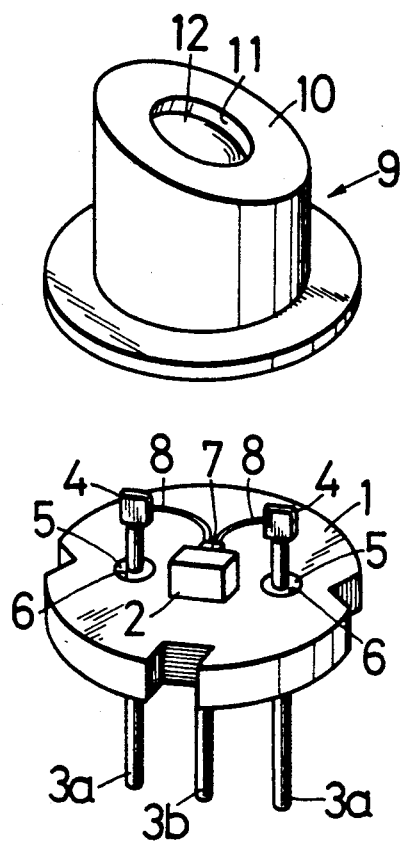
FIG. 1 is a fragmentary perspective view of a semiconductor laser device to which the present invention is applied.
Figure 2:
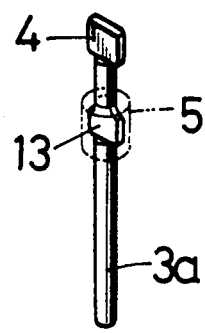
FIG. 2 is a perspective view of a lead to be assembled to a stem by way of an electrically insulating resin.

Referring first to FIGS. 1 and 2, there is shown a semiconductor laser device to which the present invention is applied. The semiconductor laser device shown includes a stem 1 made of a metal, a supporting portion 2 formed in an integral relationship at a substantially central portion of a surface of the stem 1, and three leads 3a and 3b formed from soft steel wires having surfaces plated with gold. Two 3a of the leads 3a and 3b are crashed at upper end portions 4 thereof and also at intermediate portions 13 thereof as seen in FIG. 2. The intermediate crashed portions 13 of the leads 3a extend through a pair of lead mounting holes 6 perforated in the stem 1 and are fixed to the stem 1 each by way of an electrically insulating resin block 5. The remaining lead 3b has a smaller overall length than the leads 3a and is directly welded to a bottom face of the stem 1.

A semiconductor laser element 7 is bonded to the supporting portion 2 of the stem 1 and includes a photodiode not shown for monitoring an output laser beam thereof. A pair of electrodes not shown of the semiconductor laser element 7 are connected to the upper end crashed portions 4 of the leads 3a each by way of a connecting wire 8. A sealing cap 9 is mounted on the stem 1 and has a head portion 10 formed obliquely for the correction of an astigmatic difference. A window 11 for passing light therethrough is formed in the head portion 10 of the sealing cap 9 and is closed with a glass plate 12.

Figure 6:
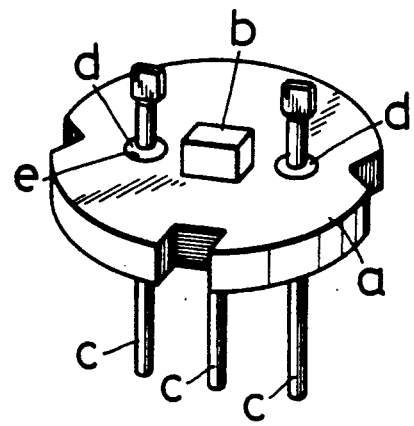
FIG. 6 is a perspective view showing a stem and a lead of a conventional semiconductor laser device.
Figure 7A:
FIGS. 7A and 7B are perspective views showing different successive steps of a process of fixing a lead to the stem of the semiconductor laser device shown in FIG. 6.
Figure 7B:
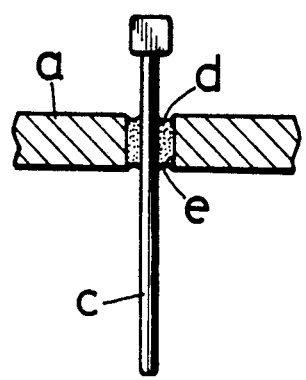

The present semiconductor laser device is different from the conventional semiconductor laser device shown in FIG. 6 in that electric isolation of the leads 3a from the stem 1 is provided by the resin blocks 5. Accordingly, in production of a semiconductor laser device, a lead can be assembled by a very simple assembling process. In particular, a pair of leads 3a are prepared in advance which are plated with a suitable metal and have resin blocks 5 molded around the intermediate crashed portions 13 thereof as seen in FIG. 2, and then the molded resin blocks 5 are press fitted into the lead mounting holes 6 of a stem 1. After then, a pressure is applied radially inwardly to an outer periphery of the stem 1 to caulk the stem 1 to fix the leads 3a rigidly to the stem 1. With such assembling process, the number of steps required for the production of a semiconductor laser device is reduced. Further, the electrically insulating resin blocks 5 which may be formed, for example, from polyphenylene sulfide (PPS) or polyimide (PIQ) reduce a required material cost comparing with conventionally employed glass rings which are produced by molding glass powder as a principal material.

Accordingly, the cost of a semiconductor laser device can be reduced.

Figure 3A:
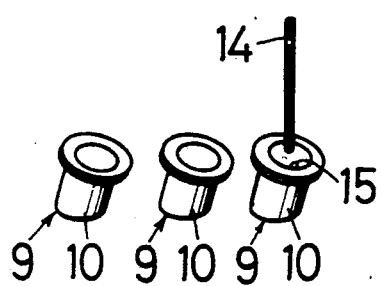
FIGS. 3A to 3C are perspective views showing different successive steps of a process of fixing a glass plate to a cap.
Figure 3B:
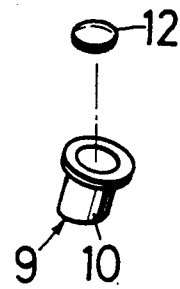
Figure 3C:
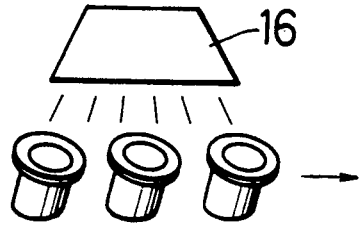

Referring now to FIGS. 3A to 3C, there are shown different successive steps of a process of fixing the glass plate 12 to the cap 9 of the semiconductor laser device shown in FIG. 1. First, an adhesive resin 15 is dropped and applied by means of a dispenser 14 to an inner face of the head portion 10 of the cap 9 which is placed with its upside down as shown in FIG. 3A. The resin 15 used has such a characteristic that it cures when it is irradiated by ultraviolet (UV) rays.

Subsequently, the glass plate 12 is dropped in position onto the inner face of the top portion 10 of the cap 9 as seen in FIG. 3B.

After then, ultraviolet rays are irradiated upon the inner face of the top portion 10 of the cap 9 from an ultraviolet (UV) lamp 16 as shown in FIG. 3C to cause the resin 15 to cure thereby to fix the glass plate 12 to the inner face of the head portion 10 of the cap 9. It is to be noted that the resin 15 may alternatively be a thermosetting resin such that the glass plate 12 may be fixed by heating the resin 15.

Figure 4A:
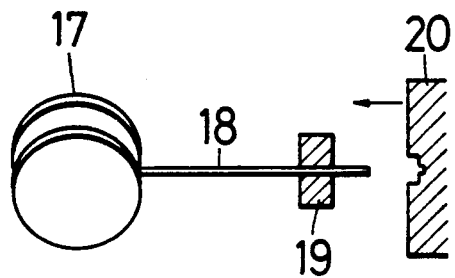
FIGS. 4A to 4D are perspective views showing different successive steps of a process of fixing a lead directly to a stem.
Figure 4B:

Referring now to FIGS. 4A to 4D, there are shown different successive steps of a process of fixing the lead 3b directly to the stem 1. First, a gold plated wire 18 wound on a reel 17 is grasped rigidly at a location of a predetermined length from an end thereof by a holder 19 as seen in FIG. 4A, and the end portion of the gold plated wire 18 is thrown against a metal die 20 for the formation of a header by the holder 19 to form a header at the end of the gold plated wire 18. The header is formed such that the end portion of the gold plated wire 18 has a flange-like shape and a projection is provided at a central portion of an end face of the flange as seen in FIG. 4B. Such flange-like shape of the header is provided in order to make the lead 3b tough against bending. Meanwhile, the projection is provided in order to improve the adhesive property of the lead 3b upon welding.

Figure 4C:
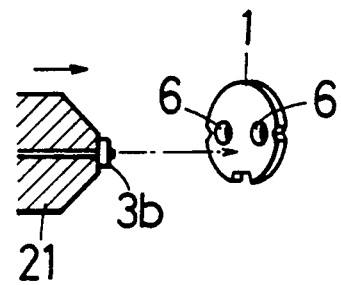
Figure 4D:
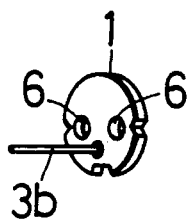

Subsequently, the lead 3b is welded to the bottom face of the stem 1 by means of a welding machine 21 as seen in FIG. 4C. Consequently, the stem 1 is obtained which has the lead 3b fixed to the bottom face thereof as shown in FIG. 4D.

Figure 5A:
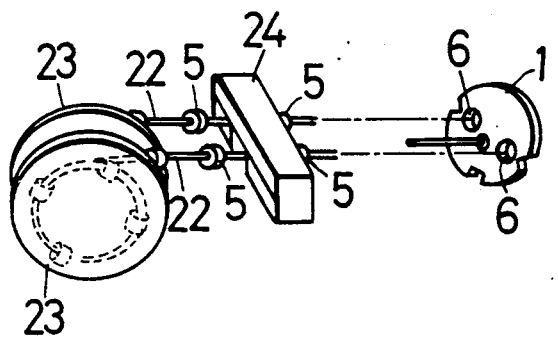
FIGS. 5A to 5D are perspective views showing different successive steps of a process of fixing another lead to the stem by way of a resin.

Referring now to FIGS. 5A to 5D, there are shown different successive steps of a process of fixing the leads 3a by way of the resin blocks 5 to the stem 1 which has the lead 3b already fixed thereto. First, a pair of material wires 22 each wound on a reel 23 are prepared as seen in FIG. 5A. Each of the material wires 22 is formed from a gold plated wire having a plurality of crashed portions 13 formed at predetermined intervals thereon and each molded in an electrically insulating resin block 5. Then, portions of the material wires 22 a little spaced rearwardly toward the reels 23 from frontmost ones of the electrically insulating resin blocks 5 which are nearest to free ends of the material wires 22 are grasped rigidly by a holder 24 as seen in FIG. 5A, and the holder 24 is moved until the material wires 22 are opposed to the lead mounting holes 6 of the stem 1. Then, the holder 24 is moved to press fit the frontmost electrically insulating resin blocks 5 of the material wires 22 into the lead mounting holes 6.

Figures 5B, 5C:
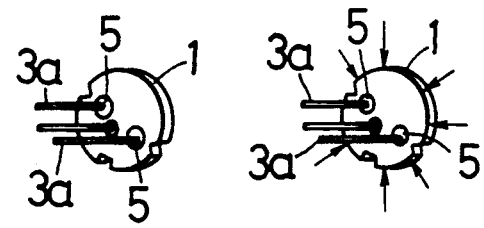
Figure 5D:
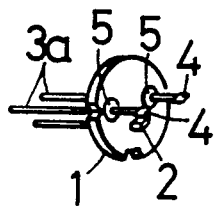

After then, the material wires 22 are cut at suitable positions between the frontmost electrically insulating resin blocks 5 and second frontmost electrically insulating resin blocks 5 thereby to obtain the stem 1 to which the leads 3a are temporarily fixed by way of the resin blocks 5 as seen in FIG. 5B.

Subsequently, a pressure is applied radially inwardly to an outer periphery of the stem 1 as seen in FIG. 5C to caulk the stem 1 to fix the leads 3a rigidly in the lead mounting holes 6 of the stem by way of the resin blocks 5.

Then, upper end portions 4 of the leads 3a are crashed as shown in FIG. 4D to facilitate subsequent bonding thereof.

After then, die bonding of a semiconductor laser element to the stem 1, bonding of connecting wires and assembly of a cap to the stem 1 are carried out successively to obtain a completed semiconductor laser device.

Having now fully described the invention, it will be apparent to one of ordinary skill in the art that many changes and modifications can be made thereto without departing from the spirit and scope of the invention as set forth herein.

What is claimed is:

1. A semiconductor laser device, comprising a stem having a lead mounting hole perforated therein, a semiconductor laser element fixed to a face of said stem, a lead having an end connected to said semiconductor element and extending through said lead mounting hole of said stem, and an electrically insulating resin element press fitted in said lead mounting hole of said stem for fixing said lead in an electrically isolated condition to said stem.

2. A semiconductor laser device according to claim 1, wherein said lead has an intermediate crashed portion around which said electrically insulating resin element is provided by molding.

3. A process of assembling a semiconductor laser device, comprising the steps of preparing in advance a lead having an electrically insulating resin element molded around an intermediate crashed portion thereof, press fitting said electrically insulating resin element together with said lead into a lead mounting hole perforated in a stem, and applying a pressure to said stem to caulk said stem to fix said lead to said stem by way of said electrically insulating resin element.

4. A process of assembling a semiconductor laser device according to claim 3, wherein the pressure is applied radially inwardly to an outer periphery of said stem.

5. A process of assembling a semiconductor laser device, comprising the steps of preparing in advance a material wire having a plurality of crashed portions formed at predetermined intervals thereon and each molded in an electrically insulating resin element, press fitting a frontmost one of the electrically insulating resin elements together with said material wire into a lead mounting hole perforated in a stem, cutting said material wire intermediately between said frontmost one and a second frontmost one of the electrically insulating resin elements to leave on said stem a lead which consists of the cut material wire and the frontmost electrically insulating resin element molded around the crashed portion of the cut material wire, and applying a pressure to said stem to caulk said stem to fix said lead to said stem by way of the electrically insulating resin element.

* * * * *